(12) United States Patent
Quan

(10) Patent No.: US 8,299,852 B2
(45) Date of Patent: Oct. 30, 2012

(54) METHOD AND APPARATUS FOR A GAIN CONTROL CIRCUIT VIA A HIGH FREQUENCY SIGNAL

(76) Inventor: Ronald Quan, Cupertino, CA (US)

( * ) Notice: Subject to any disclaimer, the term of this patent is extended or adjusted under 35 U.S.C. 154(b) by 0 days.

(21) Appl. No.: 13/038,027

(22) Filed: Mar. 1, 2011

(65) Prior Publication Data

US 2011/0221526 A1 Sep. 15, 2011

Related U.S. Application Data

(60) Provisional application No. 61/312,010, filed on Mar. 9, 2010.

(51) Int. Cl.
*H03F 1/26* (2006.01)
(52) U.S. Cl. ....................................... 330/149

(58) Field of Classification Search ................... 330/149; 455/114.3; 375/296–297
See application file for complete search history.

(56) References Cited

U.S. PATENT DOCUMENTS 7,170,342 B2 * 1/2007 Suzuki et al. ................. 330/149
* cited by examiner

*Primary Examiner* — Hieu Nguyen
(74) *Attorney, Agent, or Firm* — George B. Almeida

(57) ABSTRACT

A gain control amplifier provides amplitude variation of an input signal that is coupled to the amplifier, by adding or combining a higher frequency signal that overdrives or distorts the amplifier to one or more degree(s), to provide the gain variation of the input signal. A predistortion circuit may be included to further reduce distortion of the input signal at the output of the amplifier.

9 Claims, 8 Drawing Sheets

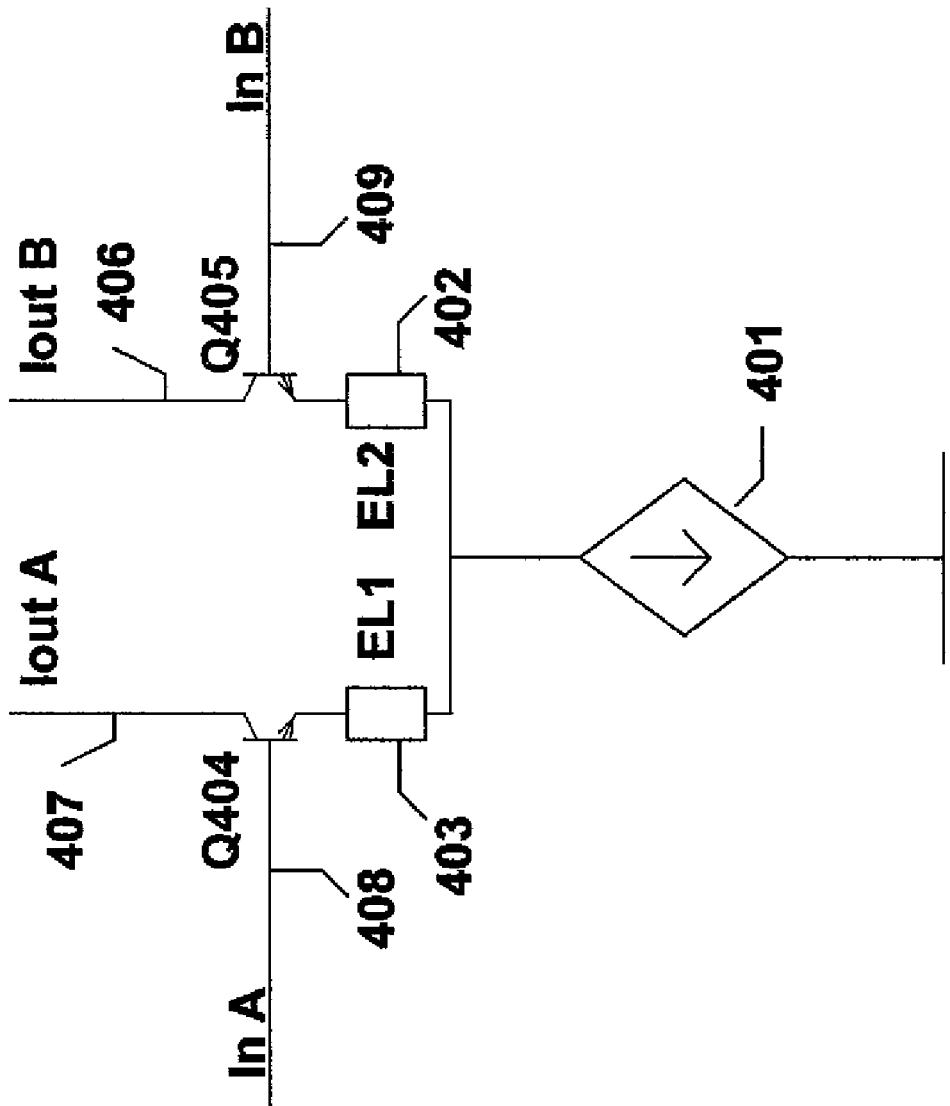

METHOD AND APPARATUS FOR A GAIN CONTROL CIRCUIT VIA A HIGH FREQUENCY SIGNAL

This application claims priority to U.S. provisional Ser. No. 61/312,010 filed on Mar. 9, 2010, which is incorporated herein by reference.

BACKGROUND

The present invention relates to voltage controlled amplifiers, and more particularly to a voltage controlled amplifier which is purposely overdriven and or distorted to provide gain variation of an input signal.

Normally a signal is controlled in terms of gain via a direct current (DC) voltage source. Conventional voltage controlled amplifiers have distortion such as harmonic and or intermodulation distortion at the output for one or more DC voltage control settings.

SUMMARY

In one embodiment of the invention, an input signal supplied to an amplifier is combined with a much higher frequency signal, Vhfs. A filter is coupled to an output of the amplifier, which removes the higher frequency signal and or any distortion signals related to the higher frequency signal such as harmonics or intermodulation components. By adjusting the amplitude of the higher frequency signal, the gain or output level of the input signal is varied. In an example embodiment, the higher frequency signal (e.g., Vhfs) is adjusted to distort and or overdrive the amplifier so as to control the gain of the input signal (e.g., the lower frequency spectrum input signal). An unexpected result is that the amplified or gain controlled input signal at the output of the amplifier exhibits very low or close to zero (e.g., harmonic) distortion, as opposed for example at the amplifier's output, where the higher frequency signal exhibits significant amounts of distortion, (that can be filtered out later).

Thus, a controlled amplitude of the higher frequency signal Vhfs, combined with the input signal, provides gain control of the input signal (e.g., with low distortion).

An embodiment of the invention includes a differential (e.g., pair) amplifier such as two transistors, in which a lower frequency signal and a higher frequency signal are coupled to one or more inputs of the differential amplifier. By controlling the amplitude of one of the signals, gain or attenuation is provided to the other signal.

For example, a lower frequency signal and a higher frequency signal are combined and supplied into a differential pair transistor amplifier. When the higher frequency signal is changed in amplitude, the output of the lower frequency signal is changed in amplitude. Thus, in one embodiment, a higher frequency signal provides change in amplitude level to the lower frequency signal.

The inventor observed that the lower frequency signal at the output of the differential amplifier exhibited low distortion (e.g., while the higher frequency signal is varied in amplitude), which is an improvement over typical voltage controlled amplifiers. A suitable filter at the output of the differential amplifier may be used to remove or attenuate the higher frequency signal.

A differential amplifier may include no local feedback element(s) or local feedback element(s). Feedback element(s) may include linear and or nonlinear device(s). An example nonlinear device may include a diode and or transistor (e.g., bipolar and or field effect transistor).

The higher frequency signal may include a sinewave, triangle wave, pulse waveform (e.g., including adjustable duty cycle), and or square-wave.

The low frequency signal may include a predistortion function to at least partially offset the nonlinearity of the differential amplifier's transfer characteristic.

For example, a bipolar transistor differential amplifier typically has a hyperbolic tangent curve. A predistortion function may include an inverse hyperbolic tangent curve, or an approximation of the inverse hyperbolic tangent curve.

BRIEF DESCRIPTION OF THE DRAWINGS

FIGS. 3B, 4A, 4B show one or more example circuits or functions of an embodiment.

DETAILED DESCRIPTION

Figure 1:
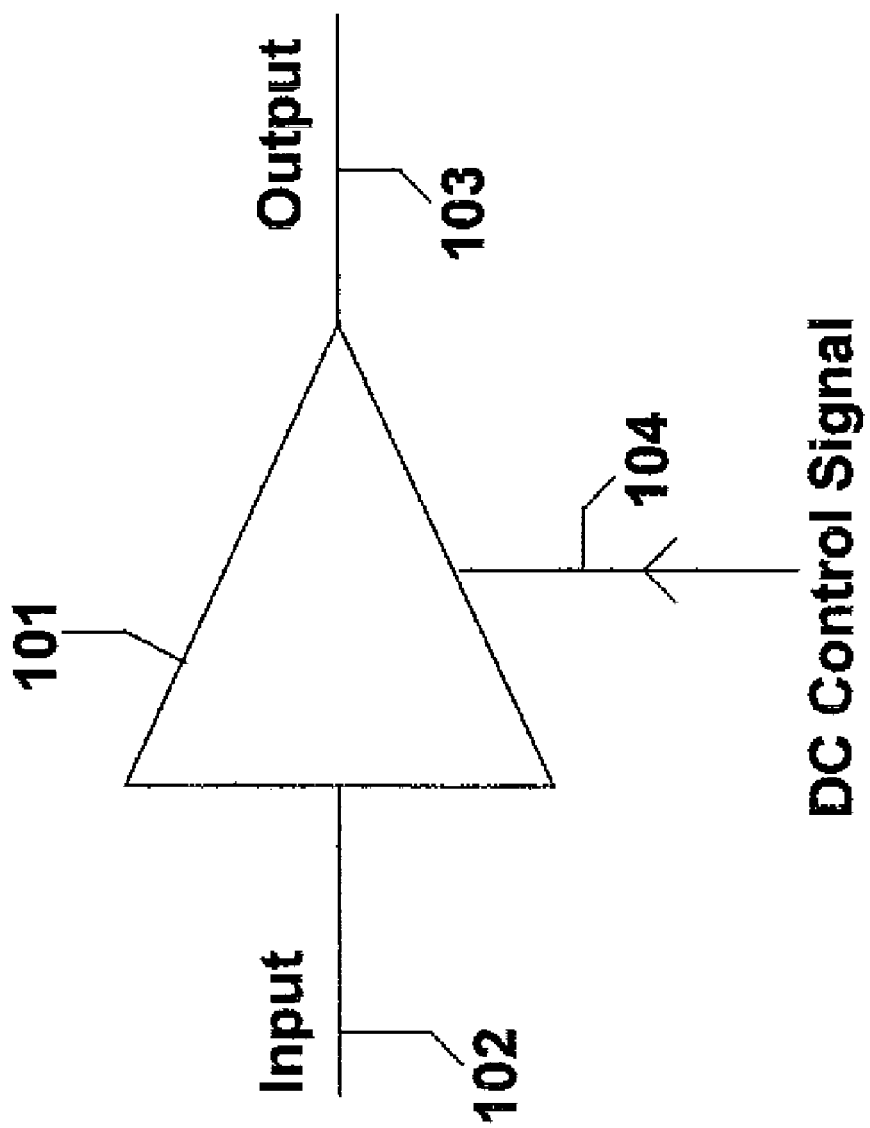
FIG. 1 shows a conventional gain control amplifier.

FIG. 1 shows a conventional gain control amplifier 101, which has an input terminal 102, a direct current or DC control signal coupled to terminal 104, and an output terminal 103. The amplitude of the input signal is controlled by the DC signal, and the only AC signal within the amplifier 101 is via input signal 102. In a conventional gain control amplifier, the operating current of one or more transistors is varied via the DC (control signal) to vary the gain of the input AC signal.

Figure 2:
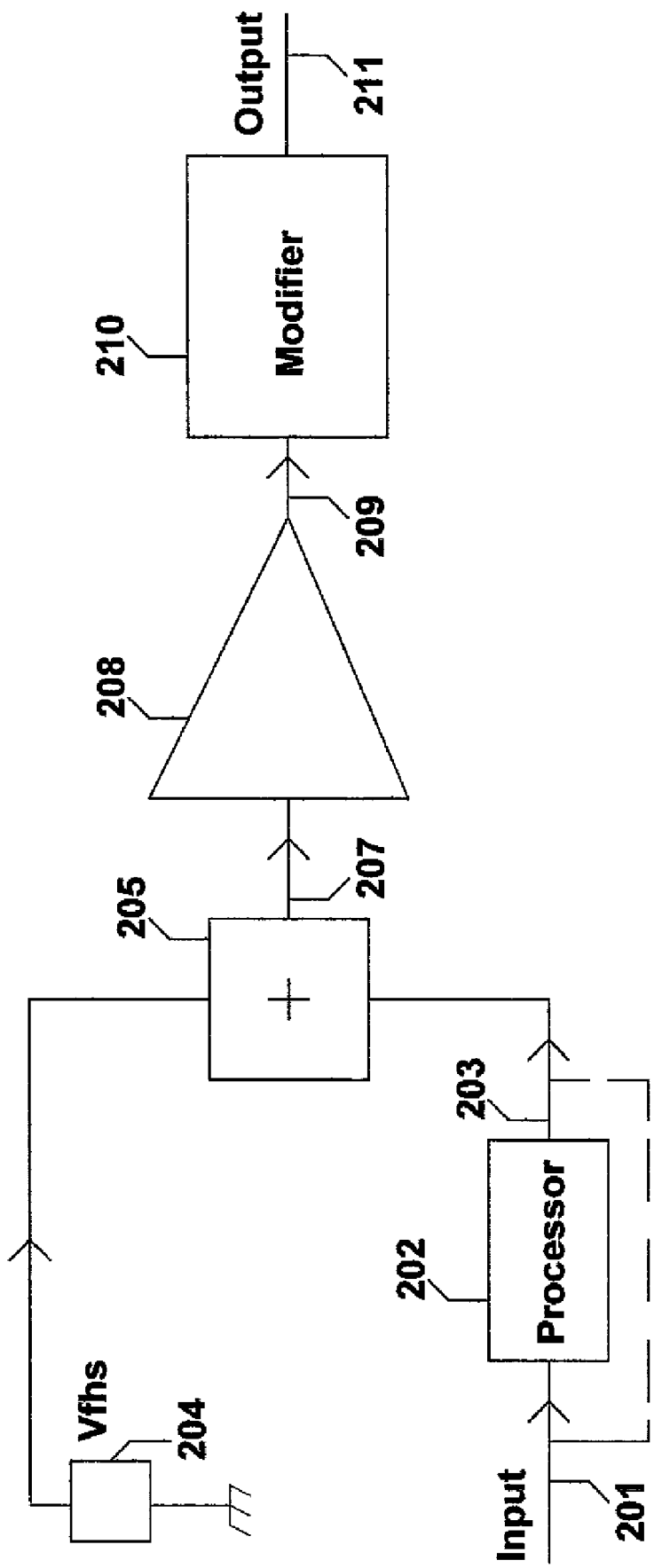
FIG. 2 shows an embodiment of the invention for controlling the gain of a signal.

FIG. 2 shows an example embodiment of controlling the amplitude of a signal via an external alternating current (AC) signal source, 204. A gain control circuit includes a summing or combining circuit 205, and an amplifier 208. The external AC signal source 204, is coupled to a first input of summer/combiner 205. A second input of summer/combiner 205 is coupled to an input signal source 201, or coupled to the input signal source 201 via an optional processor 202.

An output 207 of the summer/combiner circuit 205 is coupled to an input of amplifier 208. As the amplitude of the external AC signal source 204 is varied, an output 209 of the amplifier 208 provides a gain variation or varied amplitude version of the input signal 201. Thus, the external AC signal source 204 (e.g., a current and or voltage signal source), via amplitude variation, controls the amplitude of the input signal 201 at the output of amplifier 208. In one embodiment, external AC signal source 204 provides control of the input signal 201 via amplifier 208 via driving amplifier 208 into varying degrees of distortion (e.g., various degrees of distortion related to the external signal source such as AC signal source 204).

For example, preferably the frequency of the external AC signal source 204 is higher than the frequency or frequency spectrum (e.g., Fourier Transform) of the input signal, so that any component (e.g., frequency spectrum of AC signal 204 and or any distortion products related to the AC signal 204 and input signal 201) related to the AC signal source 204 may be filtered or attenuated via a modifier 210 coupled to the output of amplifier 208 (e.g., terminal 209). An output terminal 211 provides gain or amplitude variation of input signal 201 via amplitude (and or pulse width) variation of the AC signal source 204. For example, the AC signal source 204 (or 304) may include a sinusoid signal whose amplitude is varied (e.g., by a voltage or current controlled circuit or method), which provides amplitude variation of input signal 201. In another embodiment, the AC signal source such as 204 (or 304) may be a pulse signal (e.g., rectangular or squarewave signal including or with one or more duty cycle setting), which allows varying the amplitude of the input signal (e.g., via output of amplifier 208; or via output of modifier 210 (or 310), terminal 211 (or 311)). Note in another embodiment, varying the amplitude and or pulse-width of a pulse signal for the external signal 204 (or 304) provides a change in amplitude of the input signal at an output of the amplifier and or the modifier.

Thus one embodiment may include summer/combiner circuit 205, amplifier 208, and modifier or filter 210.

Accordingly, for low frequency applications such as an input signal 201 with audio frequencies from 20 Hz to 20,000 Hz, the external AC signal source 204 for example may be a waveform at a frequency higher than 20,000 Hz or 40,000 Hz, such as 1 MHz (or more). By varying the amplitude of the AC source signal such as a 1 MHz signal (e.g., sinewave, squarewave, pulse), and setting the modifier circuit 210 as a low pass filter between 20 KHz and 1 MHz, such as a 30 KHz low pass filter, the output of the modifier provides gain variation of the audio frequency signals via a variation in amplitude (or pulsewidth) of the 1 MHz signal source 204. Of course, other frequencies of input 201 and or AC signal source 204 may be used (e.g., depending on the application such as audio frequencies, video frequencies, servo control frequencies, radio frequencies, and or the like). Of course, other frequencies and or filters may be used.

Figure 3A:
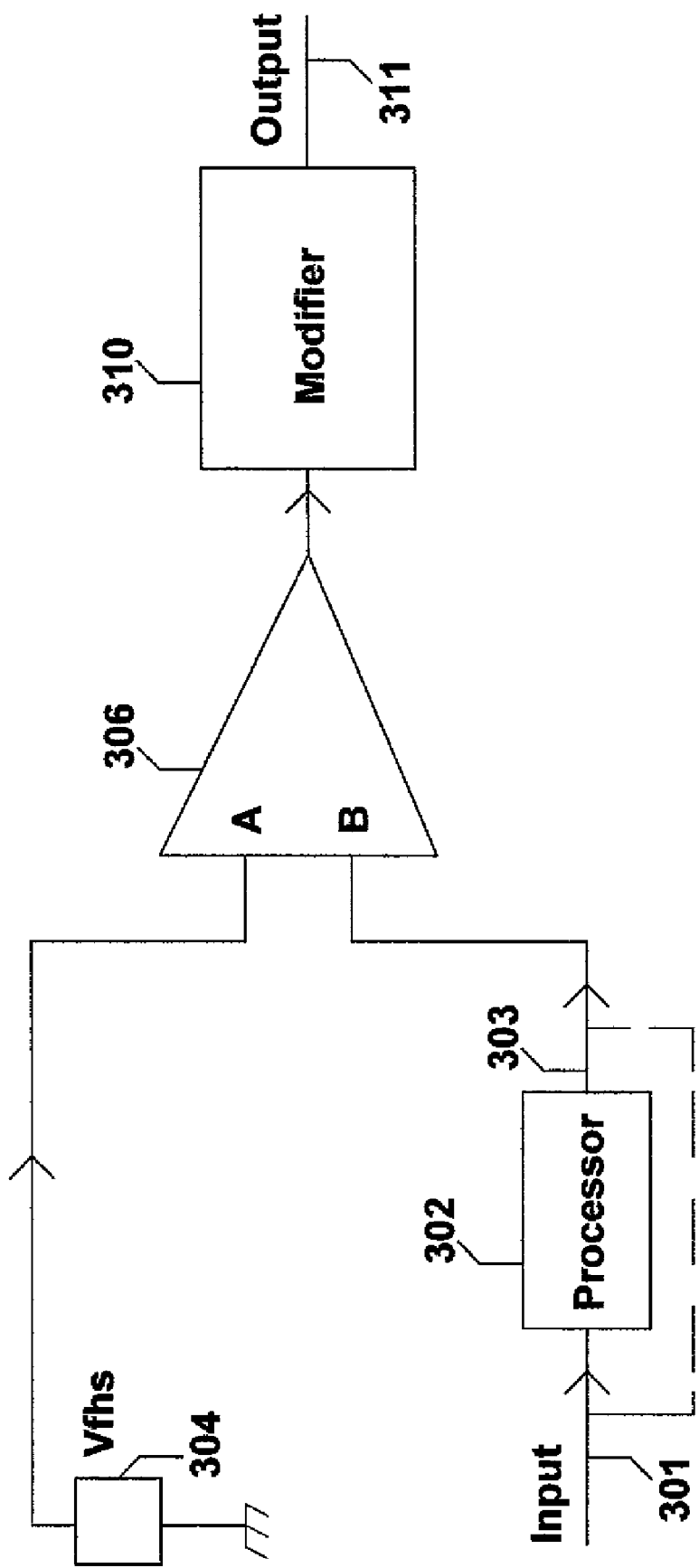
FIG. 3A shows another embodiment.
Figure 3B:
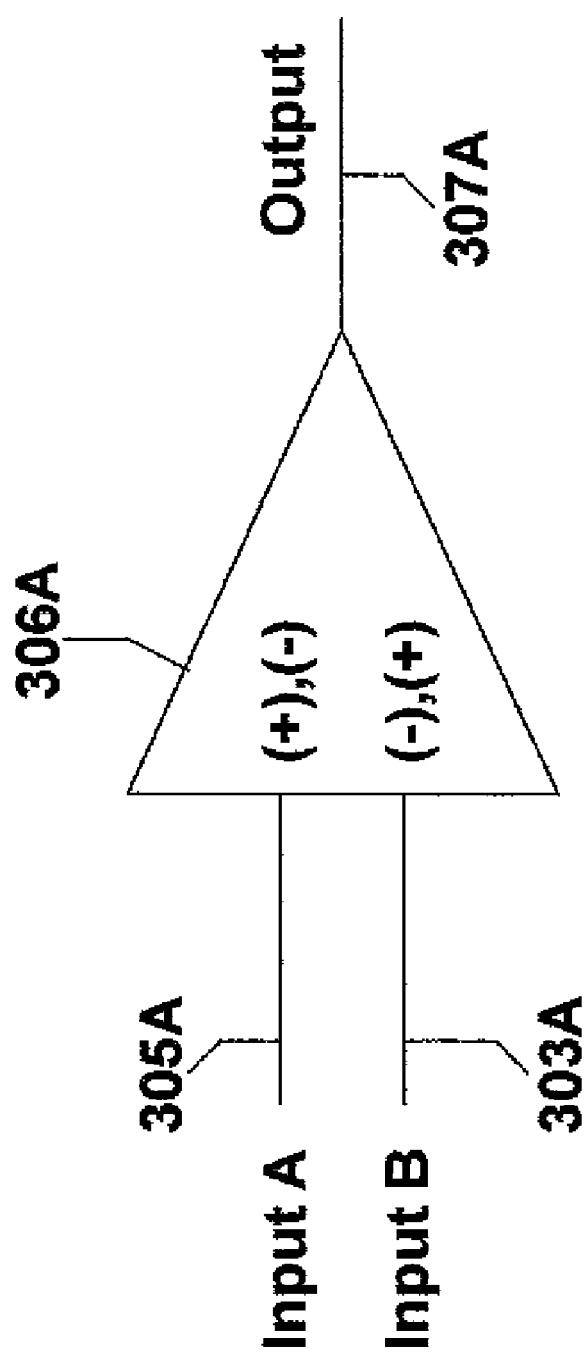
Figure 4C:
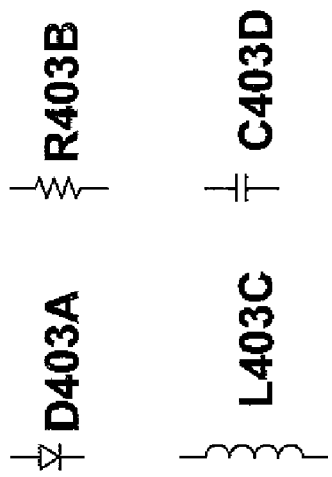
FIG. 4C shows one or more elements or devices that may be included in one or more embodiments.
Figure 4B:
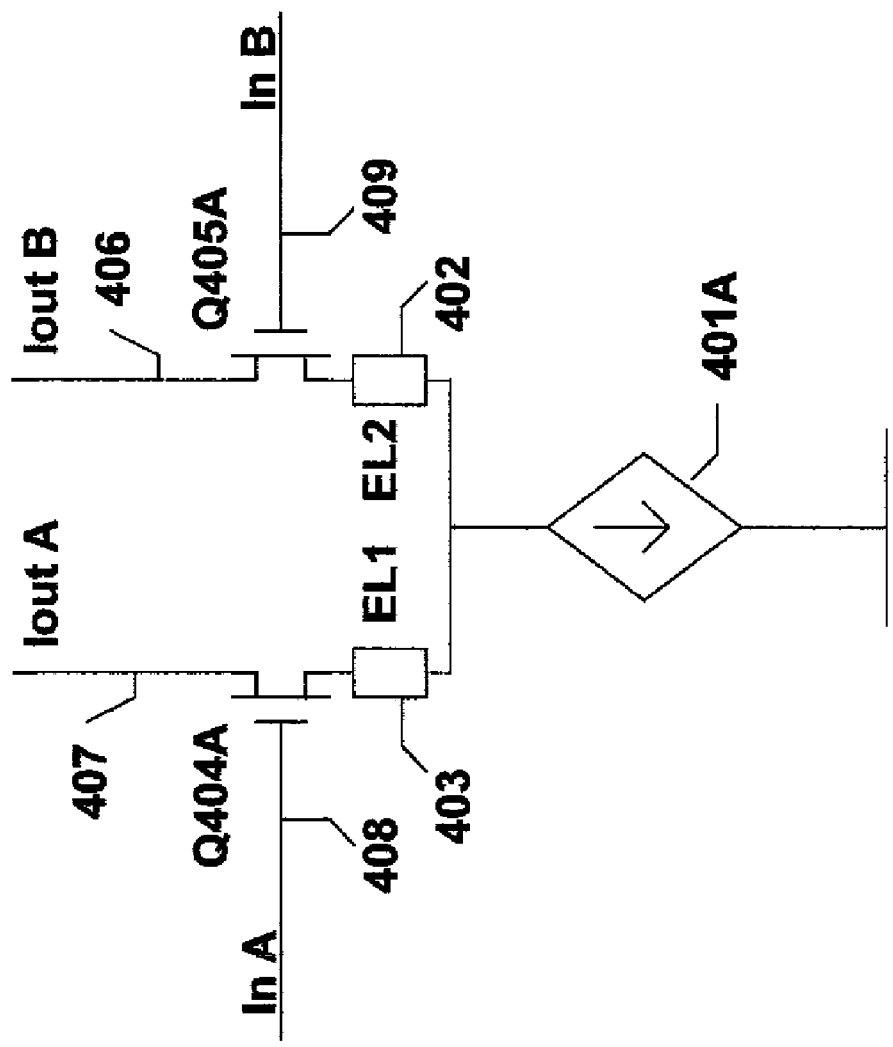

An example processor 202 may include a pre-distortion module/function/circuit to, for instance, further lower distortion, or to further linearize the transfer characteristic of the amplifier 208 (or an amplifier 306, 306A, FIGS. 3A, 3B, or differential pair amplifier in FIG. 4a and or FIG. 4B). For example, if an amplifier has a hyper-tangent transfer function, a pre-distortion module/circuit/function may substantially have an inverse hyper-tangent function. Or alternatively stated, processor 202 may include at least substantially an inverse function or inverse transfer function of any of the amplifier(s) mentioned.

An example processor/pre-distortion circuit or module may include a non-linear mapping system for a set of input values that yields a set of output values, which provides a non-linear transfer curve or function. The pre-distortion circuit or module (e.g., for block 202) may be implemented via analog and or digital domain(s). A digital approach for instance, may include an analog to digital converter (ADC) wherein the digital output of the ADC is coupled to a look-up table, and wherein the look-up table is coupled to a digital to analog converter or system to provide a non-linear or inverse function curve (e.g., of the amplifier). For example, the look-up table maps input values to provide output values that determine or provide the non-linear or inverse function transfer function or transfer characteristics (e.g., for input to output or output to input).

In another example for processor module or circuit 202, may include an amplifier whose feedback network/element or output load includes one or more non-linear elements such as diode(s), bipolar transistor(s), field effect transistor(s), non-linear resistor(s), non-linear capacitor(s), non-linear inductor(s), and or the like.

FIG. 3A shows another example embodiment with the summer/combiner 205 and amplifier 208 are replaced with a two input amplifier 306. Amplifier 306 has a first input terminal (e.g., input A is coupled to a controlling AC signal source 304) and a second input terminal (e.g., input B is coupled to an input signal or to an input signal via a processor 302). The two inputs of amplifier 306 may be of a summing or differencing type. For example, AC signal source 304, controls the gain of the input signal coupled to terminal 301. Optional processor 302 is similar to processor 202 in FIG. 2. Modifier 310 is similar to modifier 210 in FIG. 2. Output terminal 311 of modifier 310 provides a gain varying signal or waveform of the input signal (301) wherein the varying gain is related to the amplitude and or pulse width of external AC signal 304.

FIG. 3B shows an embodiment wherein a two input amplifier such as a differential amplifier 306A is substituted for the amplifier 306 in FIG. 3A, or for the summer/combiner 205 and amplifier 208 in FIG. 2. Differential amplifier 306A may have as a first input a non-inverting input, and a second input as an inverting input, or vice versa (e.g., as indicated by the (+) and (-) signs denoted inside amplifier 306A).

In another embodiment, amplifier 306 or 306A may include a modifier, such as for example a filter circuit or function or block 210 (or 310), to reduce or remove signals related to the external signal source 204 (FIG. 2).

FIGS. 4A and 4B are example amplifiers for amplifiers 306 or 306A.

FIG. 4A shows a differential amplifier employing transistors Q404 and Q405. A first input terminal, 408, is coupled to the base of transistor Q404, and a second input terminal, 409, is coupled to the base of transistor Q405. The emitter(s) of transistor Q404 and or Q405 may (or may not) include one or more local feedback element(s) as denoted by element 403 (EL1) and or element 402 (EL2). The feedback element(s) can include one or more non-linear device (e.g., transistor, field effect transistor, diode) and or one or more linear device(s) such as a capacitor, resistor, and or inductor. In another embodiment, the differential amplifier may omit one or more feedback element. For example, when omitting a feedback element, a wire may be use. For instance, one embodiment may include having the emitters of bipolar transistors (or sources or field effect transistors) coupled or connected together. Current source 401 provides direct current biasing for transistors Q404 and Q406.

Typically, an input signal is coupled to the base of one of the transistors, while the AC signal that controls the amplitude of the input signal is coupled to the base of the other transistor. An output signal from one or both collectors (terminal 407 and or terminal 406) of the transistors Q404 and or Q405 may be coupled to an input of a modifier or filter (e.g., modifier 210, 310) to remove/reduce the amplitude or level of one or more signals related to the AC signal that controls the amplitude of the input signal. For example, the AC signal previously mentioned typically has a higher frequency than the input signal's spectrum, so the modifier may include a filter such as a low pass or band pass filter to allow passage of the input signal's spectrum while rejecting one or more signals related to the AC signal (e.g., fundamental frequency, harmonic(s) of the AC signal; and or intermodulation distortion components of the AC signal and the input signal).

Feedback elements 403 and or 402 may be used to increase linearity of the amplifier and or reduce, for example, random, shot, and or thermal noise at the output terminals 407 and or 406.

FIG. 4B shows a similar amplifier that includes field effect transistors in place of the bipolar transistors used in FIG. 4A. Operation of this amplifier with the field effect transistors, Q404A and Q405A is similar to the amplifier of FIG. 4A. Current source 401A provides a direct current biasing for the sources Q404A and Q405A. One or more output signals are provided via the drains of Q404A and or Q405A. Typically, an input signal is coupled to the gate of one of the field effect transistors, while the AC signal that controls the amplitude of the input signal is coupled to the gate of the other field effect transistor FIG. 4C shows one or more devices such as a diode D403A (e.g., or a transistor or field effect transistor), resistor R403B, inductor L403C, and or capacitor C403D, that can be included as a network (e.g., series and or parallel) for the feedback elements 403 and or 402 of FIGS. 4A, 4B.

It should be noted that the feedback elements 403 and or 402 may be optional. For example, element 403 and or element 402 may include or may be a wire or low resistance resistor.

Figure 5A:
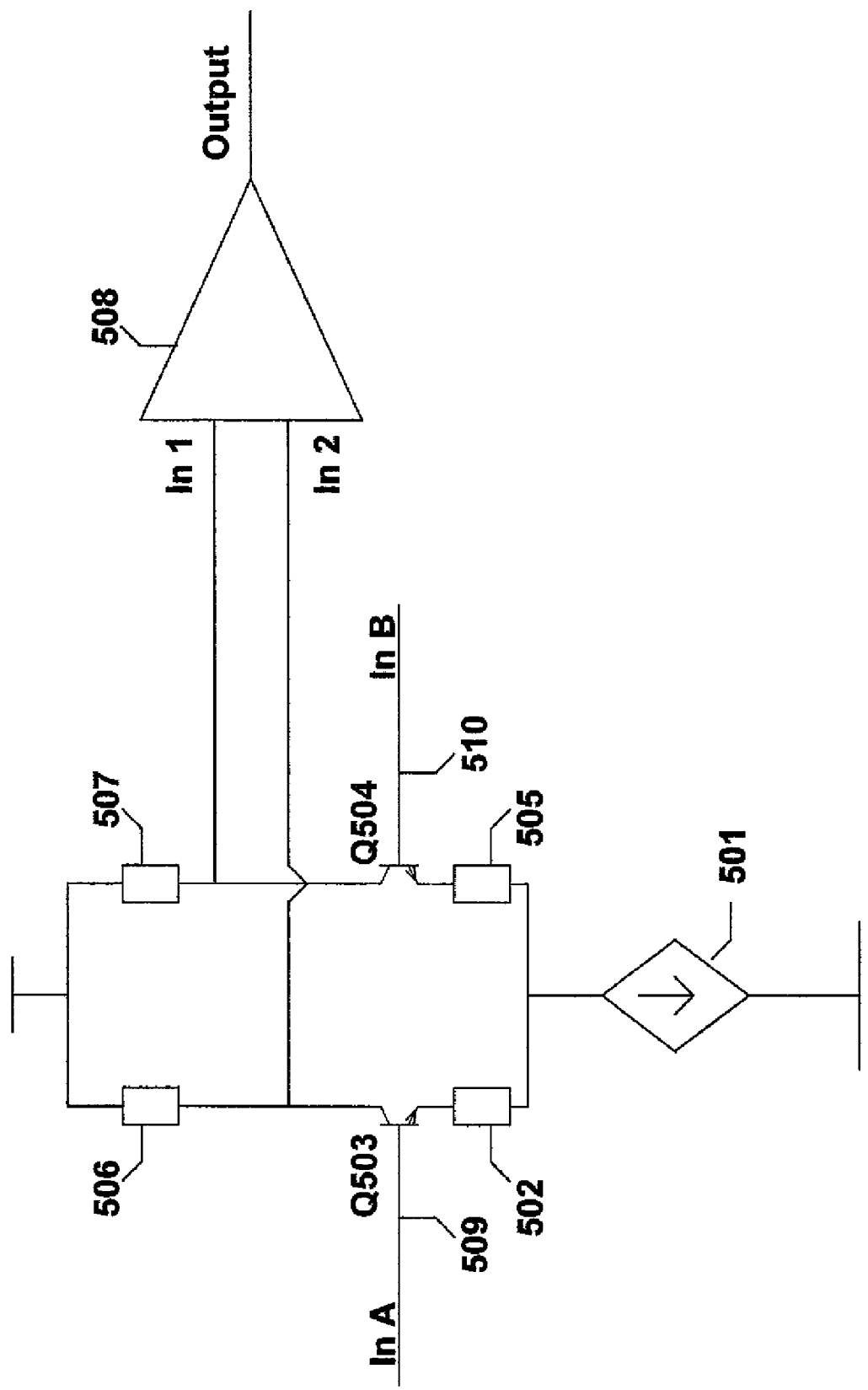
FIGS. 5A and 5B show examples of signal conditioners or processors that may be included in one or more embodiments.
Figure 5B:
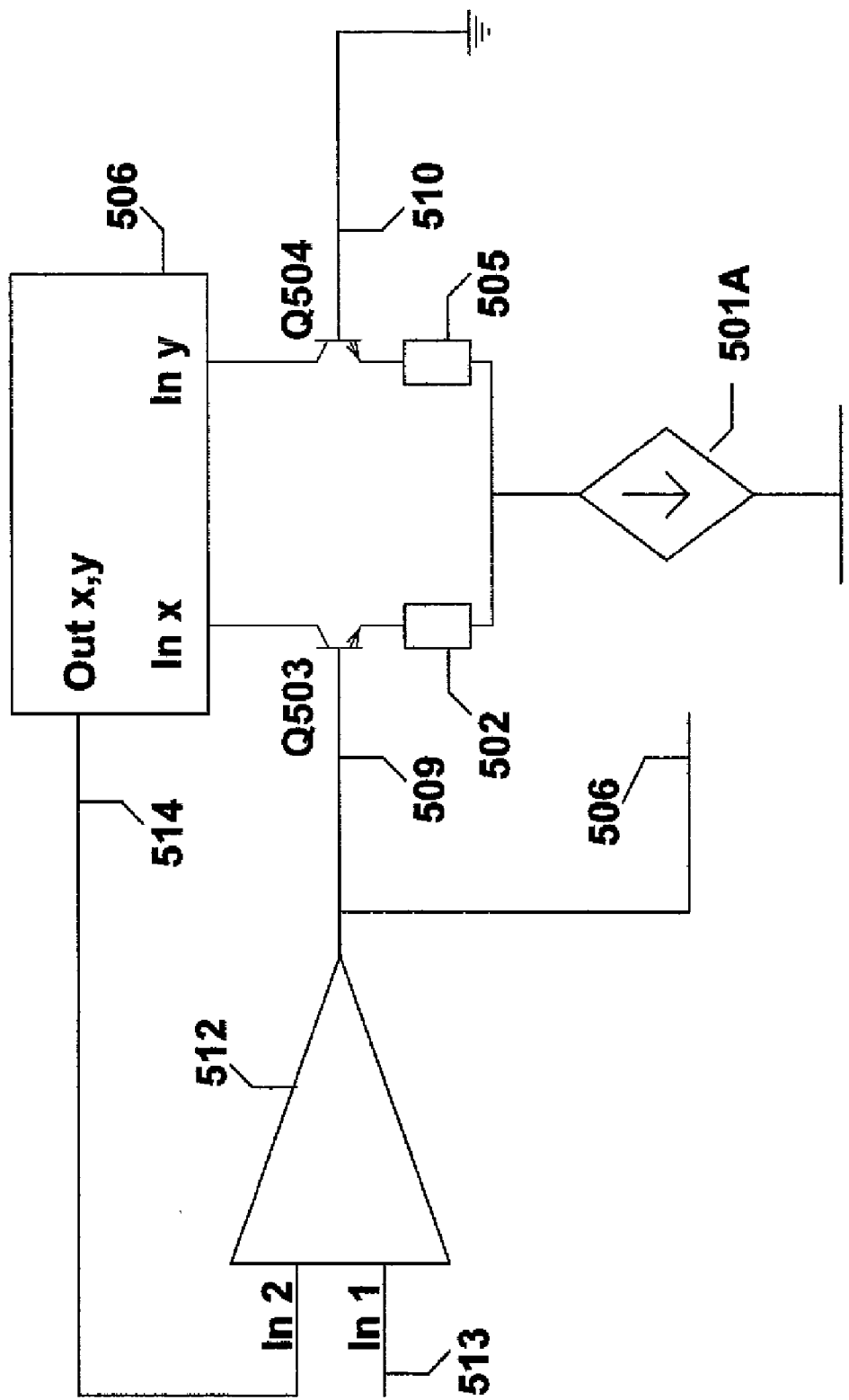

FIGS. 5A and 5B show examples of processor circuits that provide pre-distortion or an inverse transfer function to an amplifier, such that when an input signal is coupled to an input of the processor and an output of the processor is coupled to the amplifier, the amplifier's output has substantially a linear relationship (e.g., low or negligible distortion at the amplifier's output terminal).

In one example of the circuit of FIG. 5A, the feedback back elements 502 and 505 include resistors (or one or more linear elements) to linearize the overall transconductance for an input signal source voltage across the bases of transistors Q503 and Q504 to the output collector currents of transistors Q503 and Q504. In one embodiment, the input signal source is coupled to terminal 509 and terminal 504 is coupled to a ground (or vice versa). Non-linear load elements 506 and 507, such as or including one or more diodes (or transistor(s) or field effect transistor(s)), provide outputs to the inputs of a (e.g., linear) differential amplifier 508. The output of amplifier 508 then provides an inverse transformation or inverse function, for example, for the differential amplifier in FIG. 4A. For example, the output of differential amplifier 508 is coupled to one of the bases in FIG. 4A such as terminal 409, and the other base terminal 408 is coupled to the AC signal source, for controlling the amplitude or gain of the input signal voltage source (e.g., that is coupled across the bases of transistors 503 and 504 of FIG. 5A). Alternatively, the collectors of Q503 and Q504 may be coupled to the bases of the amplifier in FIG. 4A, with an input signal coupled to one input of the predistortion circuit (e.g., base of Q503), and the controlling AC signal to the other input of the pre-distortion circuit (e.g., base of Q504); amplifier 508 is optional in this alternative example. It is also noted that constant DC current source 501 provides biasing for the transistors Q503 and Q504 to operate (e.g., in a normal, or forward active region).

FIG. 5B shows another processor circuit for providing predistortion with a similar result as the circuit in FIG. 5A. Here an input signal is coupled to a first input (e.g., In 1) terminal of amplifier 512, such as terminal 513. The output of the amplifier 512 is coupled to a circuit similar to the amplifier that is to be linearized or the amplifier that requires an inverse function. In this example, the circuit includes transistors Q503 and Q504 with optional feedback elements 502 and 505, which for example elements 502 and or 505 are substantially similar to elements 403 (EL1) and or 402 (EL2). For example, optional feedback elements 502 and or 505 (of a predistortion device or circuit) should substantially match the feedback elements used in the differential amplifier in FIG. 4A or FIG. 4B to provide a linearization effect. Constant DC current source 501A provides biasing current to transistors Q503 and Q504 to operate in a normal (e.g., or forward active) region. Thus, the output of an amplifier 512 is coupled to a base of transistor Q503, whereas the base of transistor Q504 is normally coupled to ground. Output collector current(s) from transistor Q503 and or Q504 are coupled to one or more inputs of a level shifter, load (e.g., resistor, transistor), and or differential to single ended converter, 506. In general, the block 506 is a processing circuit. An output of the processing circuit 506, is coupled to a second input (e.g., In 2) of the amplifier 512. Inputs In1 and In2 in one embodiment forms a differential input for amplifier 512. In one example, the feedback circuitry from processor 506 to amplifier 512 provides negative feedback to force the input signal to substantially match the output signal from transistor 503 and or 504. Thus, the output of amplifier 512, terminal 506, provides an inverse function or predistortion signal for a differential amplifier such as illustrated in FIG. 4A.

If the bipolar transistors 503 and 504 in FIG. 5B are replaced with field effect transistors, then the output of amplifier 512 (e.g., terminal 506) will provide an inverse function or predistortion circuit for a field effect transistor differential amplifier such as illustrated in FIG. 4B.

It should be noted that other types of amplifiers may be included as alternative embodiments to the example differential amplifiers. For example, a single ended amplifier such as a common emitter or source amplifier, a common base or gate amplifier, and or an emitter follower or source follower circuit may be used in any combination or in place of any of the amplifiers, differential amplifiers, and or differential pair circuits (e.g., as shown in FIGS. 2, 3A, 3B, 4A, and or 4B).

Another embodiment for predistortion functions or circuits may include a single ended amplifier approach. Predistortion circuits of FIGS. 5A and or 5B may be modified from a differential pair predistortion circuit to a single ended amplifier.

One embodiment of a predistortion circuit for a single ended amplifier may include a common emitter or common source amplifier including a non-linear load at its emitter or drain that includes (e.g., or not includes) negative feedback element(s), which can include linear and or non-linear element(s). For example, a predistortion circuit may be used including a common emitter or source amplifier with a non-linear load element (e.g., transistor, diode, and or field effect transistor) and or a linear element (e.g., resistor, inductor, and or capacitor). It should be noted that an input signal is coupled to the base or gate of the common emitter and or common source amplifier, and a collector or drain provides an output for this predistortion circuit.

Another embodiment may include a common emitter or common source amplifier whose collector or drain is coupled to a first input of a feedback amplifier (e.g., op amp), and wherein the second input of the feedback amplifier is coupled to an input signal, and wherein a predistortion signal is provided by the output of the feedback amplifier, and wherein the output of the feedback amplifier is coupled to the base or gate of the common emitter or common source amplifier. The common emitter or common source amplifier may (or may not) include one or more negative feedback element(s) that includes linear or non-linear element (e.g., such as examples previously discussed for elements or devices 403 and or 402).

U.S. Pat. No. 6,617,910 "Low Noise Analog Multiplier Utilizing Nonlinear Local Feedback Elements" by Ronald Quan, incorporated by reference, provides one or more examples of circuits, amplifiers, differential amplifiers, and or pre-distortion circuits that may be used in any of the embodiments previously mentioned.

This disclosure is illustrative and not limiting; further modifications will be apparent to one skilled in the art and are intended to fall within the scope of the appended claims and or of the embodiments described.

That which is claimed is:

1. A method of varying a gain of an amplifier having a first signal coupled to an input of the amplifier, by varying the amplitude of a second signal that is also coupled to the input of the amplifier, comprising:
   combining the first and second signals and providing the combined signal to the input of the amplifier, wherein the second signal is an alternating current signal;
   adjusting an amplitude level of the second signal so as to control the gain of the amplifier in respect to amplifying the first signal, by overdriving the amplifier; and
   wherein the alternating current signal is varied in amplitude and or pulse-width to provide various degrees of harmonic and or intermodulation distortion for the alternating current signal at the output of the amplifier, while substantially providing a varied amplitude of the first signal at the output of the amplifier, with substantially lower distortion of the first signal when compared to the distortion of the alternating current signal.

2. The method of claim 1 further including a predistortion circuit wherein an input of the predistortion circuit is coupled to the first signal and an output of the predistortion circuit is combined with the second signal and is coupled to the input of the amplifier.

3. The method of claim 2 wherein the amplifier is a differential amplifier.

4. Apparatus for varying the level of an input signal comprising:
   an amplifier;
   a source of an input signal of a selected frequency or frequency spectrum;
   a source of an alternating current signal of a frequency higher than the frequency or frequency spectrum of the input signal;
   wherein the input signal and the alternating current signal are operatively supplied to the amplifier; and
   wherein the external alternating current signal is varied in amplitude and or pulse-width so as to overdrive the amplifier to provide various degrees of harmonic and or intermodulation distortion for the external alternating current signal at the output of the amplifier, while substantially providing a varied amplitude of the input signal at the output of the amplifier, with substantially lower distortion of the input signal when compared to the distortion of the external alternating current signal.

5. The apparatus of claim 4 further including:
   a predistortion circuit, wherein an input of the predistortion circuit is coupled to the input signal and an output of the predistortion circuit is coupled to a first input of the amplifier.

6. The apparatus of claim 4 wherein the amplifier includes a differential amplifier.

7. The apparatus of claim 5 wherein the amplifier is a differential amplifier.

8. A method of varying a gain of an amplifier via a first signal that is coupled to a first input of the amplifier by varying the amplitude of a second signal that is coupled to a second input of the amplifier, comprising:
   coupling the first signal to the first input of the amplifier and coupling the second signal into the second input of the amplifier, wherein the second signal is an alternating current signal;
   varying the amplitude of the second alternating current signal to overdrive the amplifier, to vary the gain of the amplifier by varying the amplitude of the first signal at the output of the amplifier;
   wherein the second signal alternating current signal is varied in amplitude and or pulse-width to provide at the output of the amplifier various degrees of harmonic and or intermodulation distortion for the second alternating current signal, while the output of the amplifier is substantially providing a varied amplitude of the first signal at the output of the amplifier, with substantially lower distortion of the first signal when compared to the distortion of the second alternating current signal.

9. The method of claim 8 wherein the amplifier includes a differential amplifier.

* * * * *